United States Patent
Cho et al.

(10) Patent No.: US 12,290,007 B2
(45) Date of Patent: Apr. 29, 2025

(54) MAGNETIC MEMORY DEVICE AND METHOD OF OPERATING THE SAME

(71) Applicant: SAMSUNG ELECTRONICS CO., LTD., Suwon-si (KR)

(72) Inventors: Siyeon Cho, Hwaseong-si (KR); Taeyoung Kim, Seoul (KR); Hyunmog Park, Seoul (KR); Bongyong Lee, Suwon-si (KR); Yukio Hayakawa, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 259 days.

(21) Appl. No.: 17/966,183

(22) Filed: Oct. 14, 2022

(65) Prior Publication Data
US 2023/0292630 A1  Sep. 14, 2023

(30) Foreign Application Priority Data
Mar. 11, 2022 (KR) .................... 10-2022-0031008

(51) Int. Cl.
*G11C 11/15* (2006.01)
*G11C 11/16* (2006.01)
(Continued)

(52) U.S. Cl.
CPC .......... *H10N 52/80* (2023.02); *G11C 11/161* (2013.01); *G11C 11/18* (2013.01); *H10B 61/00* (2023.02); *H10N 50/85* (2023.02); *H10N 52/00* (2023.02)

(58) Field of Classification Search
CPC ........ H10N 52/80; H10N 50/85; H10N 52/00; H10N 50/10; G11C 11/161; G11C 11/18;
(Continued)

(56) References Cited

U.S. PATENT DOCUMENTS 7,514,271 B2  4/2009  Gaidis et al.
7,551,469 B1  6/2009  Parkin
(Continued)

FOREIGN PATENT DOCUMENTS

EP  2353167 B1  6/2012

OTHER PUBLICATIONS

Emori et al., Journal of Applied Physics, vol. 129, 020901 (2021).
(Continued)

*Primary Examiner* — Hien N Nguyen
(74) *Attorney, Agent, or Firm* — Muir Patent Law, PLLC

(57) ABSTRACT

A magnetic memory device includes a loop-type magnetic track having a first part and a second part that are arranged in a counterclockwise direction, a first conductive line on a top surface of the first part, and a second conductive line on a bottom surface of the second part. The magnetic track includes a lower magnetic layer, a spacer layer, and an upper magnetic layer that are sequentially stacked. Each of the first and second conductive lines includes heavy metal. Each of the first and second conductive lines is configured to generate spin-orbit torque caused by current that flows therein. The spin-orbit torque causes magnetic domains in the magnetic track to move in a clockwise direction or in the counterclockwise direction.

15 Claims, 11 Drawing Sheets

(51) Int. Cl.
  *G11C 11/18* (2006.01)
  *H10B 61/00* (2023.01)
  *H10N 50/85* (2023.01)
  *H10N 52/00* (2023.01)
  *H10N 52/80* (2023.01)

(58) Field of Classification Search
  CPC .............. G11C 19/0841; G11C 11/165; G11C 11/1673; G11C 11/1675; H10B 61/00
  See application file for complete search history.

(56) References Cited

U.S. PATENT DOCUMENTS

| | | | |
|---|---|---|---|
| 8,951,811 B2 | 2/2015 | Gaidis et al. | |
| 9,117,523 B1 | 8/2015 | Morris et al. | |
| 9,583,212 B2 | 2/2017 | Parkin et al. | |
| 10,885,961 B2 | 1/2021 | Apalkov et al. | |
| 2005/0078511 A1* | 4/2005 | Parkin | B82Y 10/00 |
| | | | 365/171 |
| 2017/0092842 A1* | 3/2017 | Khalili Amiri | H10N 50/10 |
| 2017/0136603 A1 | 5/2017 | Ganapathiappan et al. | |
| 2020/0350364 A1* | 11/2020 | Wan | H10B 61/22 |
| 2021/0126189 A1 | 4/2021 | Sonobe et al. | |
| 2021/0158849 A1* | 5/2021 | Saito | G11C 11/15 |

OTHER PUBLICATIONS

Honda et al., IEEE Transactions on Magnetics (2018).
Kang et al., ACM Journal on Emerging Technologies in Computing Systems, vol. 16, No. 1, Article 2 (Oct. 2019).
Zhang et al. Scientific Reports, 6, 35062 (Oct. 11, 2016).

* cited by examiner

MAGNETIC MEMORY DEVICE AND METHOD OF OPERATING THE SAME

CROSS-REFERENCE TO RELATED APPLICATION

This U.S. nonprovisional application claims priority under 35 U.S.C § 119 to Korean Patent Application No. 10-2022-0031008, filed on Mar. 11, 2022, in the Korean Intellectual Property Office, the disclosure of which is hereby incorporated by reference in its entirety.

BACKGROUND

1 Field

Embodiments relate to a magnetic memory device, and more particularly, to a magnetic memory device that uses spin-orbit torque (SOT) and a method of operating the same.

2. DESCRIPTION OF THE RELATED ART

As electronic devices trend toward higher speed and lower power consumption, high-speed read/write operations and low operating voltages are also required for memory devices incorporated therein. In order to meet these requirements, magnetic memory devices have been developed as memory devices. Since the magnetic memory device operates at high speed and has nonvolatile characteristics, it has attracted considerable attention as a next-generation memory device. In particular, new magnetic memory devices have recently been studied and developed to use the motion of magnetic domain walls in magnetic materials.

SUMMARY

According to some embodiments, a magnetic memory device may include a loop-type magnetic track including a first part and a second part that are arranged in a counterclockwise direction; a first conductive line on a top surface of the first part; and a second conductive line on a bottom surface of the second part. The magnetic track may include a lower magnetic layer, a spacer layer, and an upper magnetic layer that are sequentially stacked. Each of the first and second conductive lines may include heavy metal. Each of the first and second conductive lines may be configured to generate spin-orbit torque caused by current that flows in each of the first and second conductive lines. The spin-orbit torque may cause magnetic domains in the magnetic track to move in a clockwise direction or in the counterclockwise direction.

According to some embodiments, a magnetic memory device may include a loop-type magnetic track including a first part and a second part that are arranged in a counterclockwise direction; a first conductive line on a top surface of the first part; and a second conductive line on a bottom surface of the second part. The magnetic track may include a lower magnetic layer, a spacer layer, and an upper magnetic layer that are sequentially stacked. Each of the first and second conductive lines may be configured to generate spin-orbit torque caused by current that flows in each of the first and second conductive lines. The first conductive line may be configured to allow the current to flow in a clockwise direction or in the counterclockwise direction. The second conductive line may be configured to allow the current to flow in the counterclockwise direction or in the clockwise direction. A direction of the current in the first conductive line may be opposite to a direction of the current in the second conductive line.

According to some embodiments, there may be a method of operating a magnetic memory device including a loop-type magnetic track including first, second, third, and fourth parts that are arranged in a counterclockwise direction, the first part and the fourth part being connected to each other; a first conductive line on a top surface of the first part; a second conductive line on a bottom surface of the second part; a third conductive line on a top surface of the third part; and a fourth conductive line on a bottom surface of the fourth part. Each of the first, second, third, and fourth conductive lines may be configured to generate spin-orbit torque caused by current that flows in each of the first, second, third, and fourth conductive lines. The method may include a first step of providing the first conductive line with a pulse to cause magnetic domains on the first conductive line to move in a clockwise direction; a second step of providing the second conductive line with a pulse to cause magnetic domains on the second conductive line to move in the clockwise direction; a third step of providing the third conductive line with a pulse to cause magnetic domains on the third conductive line to move in the clockwise direction; and a fourth step of providing the fourth conductive line with a pulse to cause magnetic domains on the fourth conductive line to move in the clockwise direction. The first, second, third, and fourth steps may be sequentially performed.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
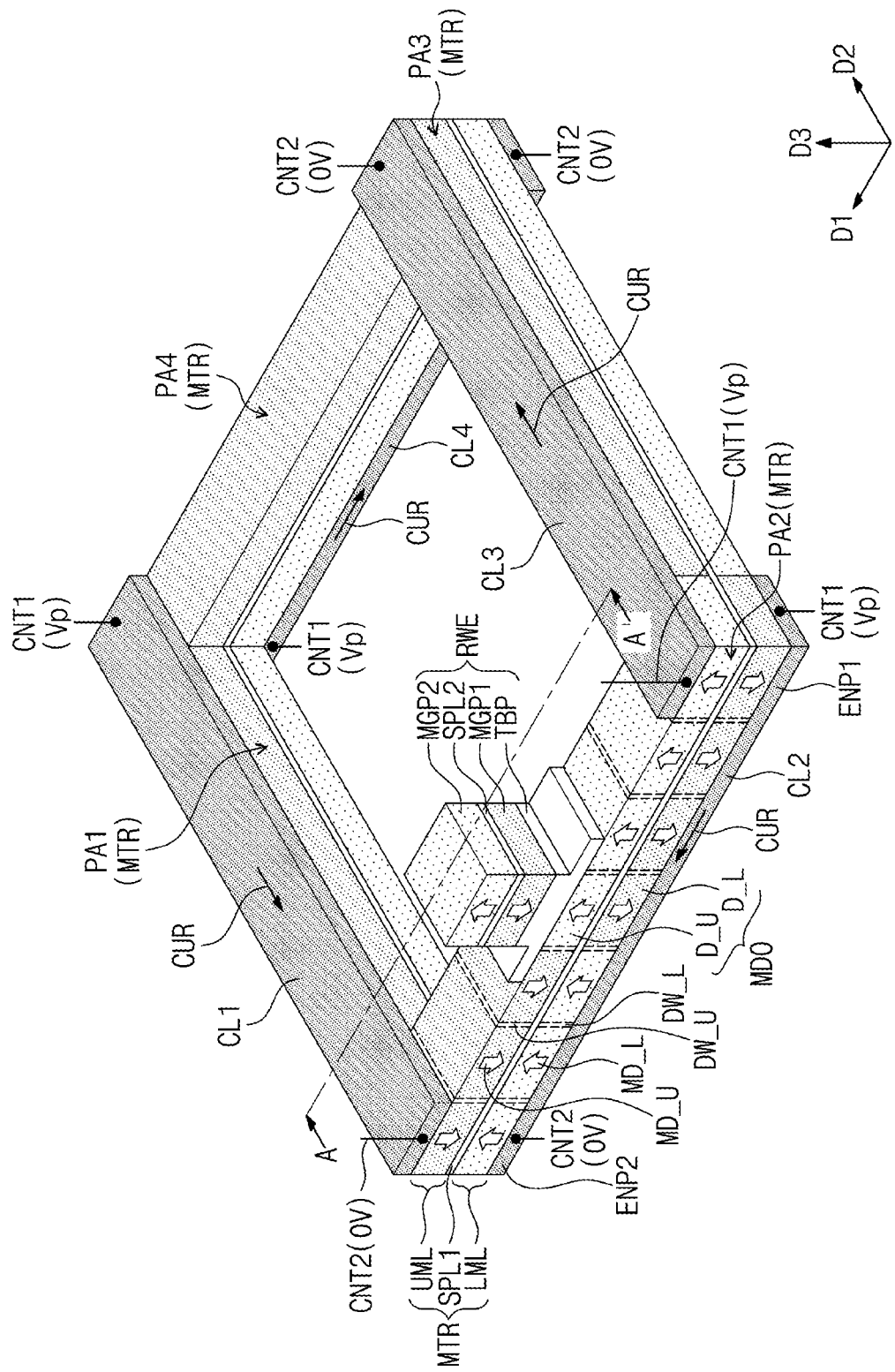
FIG. 1 illustrates a simplified perspective view of a magnetic memory device according to some embodiments.
Figure 2:
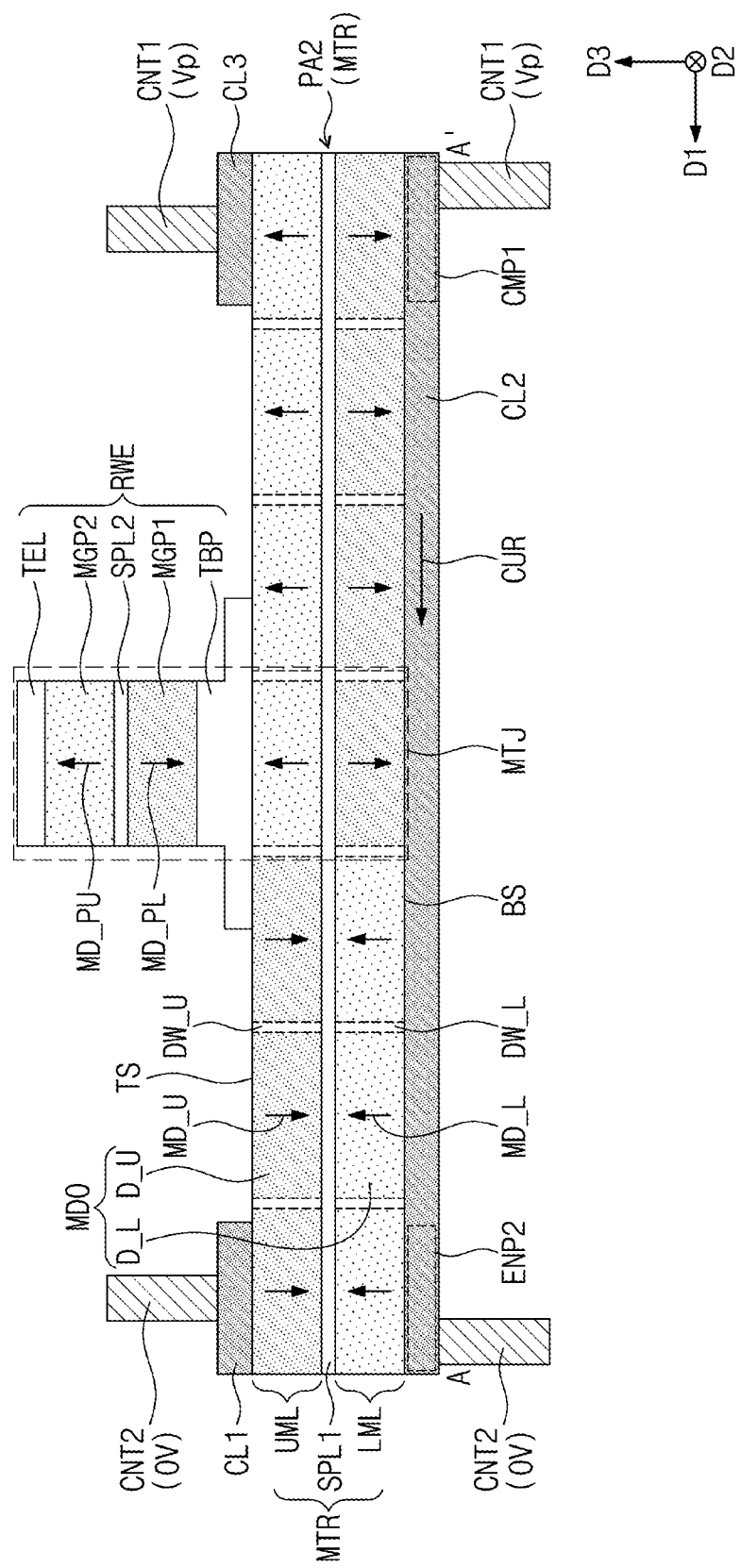
FIG. 2 illustrates a cross-sectional view along line A-A' of FIG. 1.

FIG. 1 illustrates a simplified perspective view showing a magnetic memory device according to some embodiments. FIG. 2 illustrates a cross-sectional view showing a magnetic memory device taken along line A-A' of FIG. 1.

Referring to FIGS. 1 and 2, a magnetic memory device may include a magnetic track MTR, a plurality of conductive lines CL1 to CL4 on the magnetic track MTR, and at least one read/write element RWE on the magnetic track MTR. The magnetic track MTR according to some embodiments may have a loop-type or ring-type shape.

The magnetic track MTR may be a loop-type, e.g., loop-shaped, in which opposite ends thereof are connected to each other. The magnetic track MTR may include magnetic domains MDO that circulate, e.g., along a clockwise direction, along the magnetic track MTR, and thus, a read/write element may read data from the magnetic domains MDO or write data to the magnetic domains MDO.

As illustrated in FIGS. 1 and 2, the magnetic track MTR according to the present embodiment may include a first part PA1 and a third part PA3 that extend in parallel in a second direction D2. The magnetic track MTR may further include a second part PA2 and a fourth part PA4 that extend in parallel in a first direction D1, e.g., the first and second directions D1 and D2 may be parallel to each other. The second part PA2 may connect one end of the first part PA1 to one end of the third part PA3. The fourth part PA4 may connect another end of the first part PA1 to another end of the third part PA3. The first to fourth parts PA1 to PA4 may be sequentially arranged in a counterclockwise direction, e.g., in a loop shape. As the first to fourth parts PA1 to PA4 are connected to each other, they may define the loop-type magnetic track MTR.

In the present embodiment, each of the first to fourth parts PA1 to PA4 has a linear shape, and accordingly, the magnetic track MTR may be provided to have a tetragonal loop shape. Example embodiments, however, are not limited thereto, e.g., at least one of the first to fourth parts PA1 to PA4 may have a curved shape to provide a magnetic track having an elliptical or circular loop shape.

The plurality of first to fourth conductive lines CL1 to CL4 may be provided on the magnetic track MTR. The first and third conductive lines CL1 and CL3 may extend in parallel in the second direction D2. The second and fourth conductive lines CL2 and CL4 may extend in parallel in the first direction D1. For example, the first to fourth conductive lines CL1 to CL4 may be respectively provided on the first to fourth parts PA1 to PA4 of the magnetic track MTR. The first to fourth conductive lines CL1 to CL4 may be sequentially provided along the counterclockwise direction on the magnetic track MTR.

According to some embodiments, the first to fourth conductive lines CL1 to CL4 may be alternately provided on a top surface TS or a bottom surface BS of the magnetic track MTR, e.g., the top surface TS and bottom surface BS of the magnetic track MTR may be opposite to each other along the third direction D3. For example, the first conductive line CL1 may be provided on the top surface TS at the first part PA1 of the magnetic track MTR, the second conductive line CL2 may be provided on the bottom surface BS at the second part PA2 of the magnetic track MTR, the third conductive line CL3 may be provided on the top surface TS at the third part PA3 of the magnetic track MTR, and the fourth conductive line CL4 may be provided on the bottom surface BS at the second part PA2 of the magnetic track MTR. In an embodiment, the read/write element RWE may be provided on the top surface TS at the second part PA2 of the magnetic track MTR.

In the following description, each of the first to fourth conductive lines CL1 to CL4 is called a conductive line CL. The conductive line CL may be configured to generate spin-orbit torque (SOT) by current which flows therethrough. The conductive line CL may include a material that uses current which flows in an extending direction thereof to create a spin Hall effect or a Rashba effect. The conductive line CL may include a heavy metal whose atomic number is 30 or higher. For example, the conductive line CL may include at least one of iridium (Ir), ruthenium (Ru), tantalum (Ta), platinum (Pt), palladium (Pd), bismuth (Bi), titanium (Ti), and tungsten (W).

The magnetic track MTR may include a lower magnetic layer LML, a first spacer layer SPL1, and an upper magnetic layer UML that are sequentially stacked. The lower magnetic layer LML, the first spacer layer SPL1, and the upper magnetic layer UML may be stacked along a third direction D3. The first spacer layer SPL1 may be interposed between the lower magnetic layer LML and the upper magnetic layer UML. For example, each of the lower magnetic layer LML, the first spacer layer SPL1, and the upper magnetic layer UML may have a loop shape the same as that of the magnetic track MTR. For example, as illustrated in FIG. 1, the lower magnetic layer LML, the first spacer layer SPL1, and the upper magnetic layer UML may, e.g., completely, overlap each other in a top view.

The lower magnetic layer LML may include lower magnetic domains D_L that are arranged along the clockwise or counterclockwise direction. The lower magnetic layer LML may further include lower magnetic domain walls DW_L between the lower magnetic domains D_L. For example, each of the lower magnetic domains D_L may be a region where a magnetic moment is arranged in a certain direction in the lower magnetic layer LML. Each of the lower magnetic domain walls DW_L may be a region where a magnetic moment direction is changed between the lower magnetic domains D_L. The lower magnetic domains D_L and the lower magnetic domain walls DW_L may be alternately arranged along the clockwise or counterclockwise direction.

The upper magnetic layer UML may include upper magnetic domains D_U that are arranged along the clockwise or counterclockwise direction. The upper magnetic layer UML may further include upper magnetic domain walls DW_U between the upper magnetic domains D_U. For example, each of the upper magnetic domains D_U may be a region where a magnetic moment is arranged in a certain direction in the upper magnetic layer UML. Each of the upper magnetic domain walls DW_U may be a region where a magnetic moment direction is changed between the upper magnetic domains D_U. The upper magnetic domains D_U and the upper magnetic domain walls DW_U may be alternately arranged along the clockwise or counterclockwise direction.

The upper magnetic domains D_U may vertically overlap corresponding lower magnetic domains D_L. For example, a single magnetic domain MDO may be constituted by a set of a lower magnetic domain D_L and an upper magnetic domain D_U that, e.g., completely, overlap each other, e.g., and the lower and upper magnetic domain walls DW_L and DW_U may be aligned and completely overlap each other. Each magnetic domain MDO may constitute a free layer of a magnetic tunnel junction MTJ which will be discussed below.

The lower magnetic layer LML and the upper magnetic layer UML may be antiferromagnetically coupled to each other through the first spacer layer SPL1. Each of the lower and upper magnetic layers LML and UML may include a magnetic element, e.g., at least one of cobalt (Co), iron (Fe), and nickel (Ni). The first spacer layer SPL1 may include a non-magnetic metal, e.g., at least one of ruthenium (Ru), iridium (Ir), tungsten (W), tantalum (Ta), or any alloy thereof.

In an embodiment, each of the lower and upper magnetic layers LML and UML may include at least one of, e.g., cobalt (Co), iron (Fe), and nickel (Ni), and may further include at least one non-magnetic material including, e.g., boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). For example, each of the lower and upper magnetic layers LML and UML may include at least one of a perpendicular magnetic material (e.g., CoFeTb, CoFeGd, or CoFeDy), a perpendicular magnetic material of an $Ll_0$ structure, CoPt of a hexagonal close packed lattice structure, and a perpendicular magnetic structure. The perpendicular magnetic material of the $Ll_0$ structure may include at least one of FePt of the $Ll_0$ structure, FePd of the $Ll_0$ structure, CoPd of the $Ll_0$ structure, and CoPt of the $Ll_0$ structure. The perpendicular magnetic structure may include magnetic layers and non-magnetic layers that are alternately and repeatedly stacked. For example, the perpendicular magnetic structure may include at least one of (Co/Pt) n, (CoFe/Pt) n, (CoFe/Pd) n, (Co/Pd) n, (Co/Ni) n, (CoNi/Pt) n, (CoCr/Pt) n, and (CoCr/Pd) n (where, n is the number of stacked layers). Each of the lower and upper magnetic layers LML and UML may include a CoFeB or Co-based Heusler alloy.

The at least one read/write element RWE may be disposed on the magnetic track MTR. The read/write element RWE may include either a giant magnetoresistance (GMR) sensor that uses a giant magnetoresistance effect or a tunnel magnetoresistance (TMR) sensor that uses a tunnel magnetoresistance effect. The read/write element RWE may vertically overlap one of the magnetic domains MDO in the magnetic track MTR. For example, the read/write element RWE may include a tunnel barrier pattern TBP, a first magnetic pattern MGP1, a second spacer layer SPL2, a second magnetic pattern MGP2, and an electrode pattern TEL that are sequentially stacked on the magnetic track MTR.

The tunnel barrier pattern TBP may be interposed between the first magnetic pattern MGP1 and the upper magnetic layer UML. The tunnel barrier pattern TBP may include at least one of, e.g., magnesium (Mg) oxide, titanium (Ti) oxide, aluminum (Al) oxide, magnesium-zinc (Mg—Zn) oxide, and magnesium-boron (Mg—B) oxide.

The first magnetic pattern MGP1 may be interposed between the tunnel barrier pattern TBP and the second spacer layer SPL2. The first magnetic pattern MGP1 may include at least one of, e.g., cobalt (Co), iron (Fe), and nickel (Ni). For example, the first magnetic pattern MGP1 may include at least one perpendicular magnetic material, e.g., CoFeB, FeB, CoFeBTa, CoHf, Co, and CoZr. For example, the first magnetic pattern MGP1 may include a single layer of CoFeB. In another example, the first magnetic pattern MGP1 may be a multi-layered structure including, e.g., FeB and CoFeB layers, Co and CoHf layers, or CoFeBTa and CoFeB layers.

The second spacer layer SPL2 may be interposed between the first magnetic pattern MGP1 and the second magnetic pattern MGP2. The second spacer layer SPL2 may antiparallel couple a magnetization direction MD_PL of the first magnetic pattern MGP1 to a magnetization direction MD_PU of the second magnetic pattern MGP2. For example, the second spacer layer SPL2 may provide an RKKY (Ruderman-Kittel-Kasuya-Yosida) interaction to combine with each other the magnetization directions MD_PL and MD_PU of the first and second magnetic patterns MGP1 and MGP2 to be antiparallel to each other. Therefore, magnetic fields generated by the magnetization directions MD_PL and MD_PU of the first and second magnetic patterns MGP1 and MGP2 may be counterbalanced to minimize a net magnetic field of the read/write element RWE. Accordingly, it may be possible to minimize an influence on the magnetic track MTR, which magnetic field is generated from the read/write element RWE. The second spacer layer SPL2 may include at least one of, e.g., ruthenium (Ru), iridium (Ir), tungsten (W), tantalum (Ta), and rhodium (Rh).

The second magnetic pattern MGP2 may include a perpendicular magnetic material. For example, the second magnetic pattern MGP2 may include cobalt iron terbium (CoFeTb) having a terbium (Tb) content ratio of 10% or more, cobalt iron gadolinium (CoFeGd) having a gadolinium (Gd) content ratio of 10% or more, cobalt iron dysprosium (CoFeDy), FePt of an $Ll_0$ structure, FePd of an $Ll_0$ structure, CoPd of an $Ll_0$ structure, CoPt of an $Ll_0$ structure, CoPt of a hexagonal close packed lattice structure, or an alloy thereof. In another example, the second magnetic pattern MGP2 may be a structure in which magnetic and non-magnetic layers are stacked alternately and repeatedly, e.g., at least one of Co/Pt) n, (CoFe/Pt) n, (CoFe/Pd) n, (Co/Pd) n, (Co/Ni) n, (CoNi/Pt) n, (CoCr/Pt) n, and (CoCr/Pd) n (where, n is the number of stacked layers).

The first and second magnetic patterns MGP1 and MGP2 may have their fixed magnetization directions MD_PL and MD_PU. For example, the magnetization directions MD_PL and MD_PU of the first and second magnetic patterns MGP1 and MGP2 may be substantially perpendicular to one surface (or bottom surface) of the first magnetic pattern MGP1 in contact with the tunnel barrier pattern TBP. The magnetization direction MD_PL of the first magnetic pattern MGP1 may be antiparallel fixed through the second spacer layer SPL2 to the magnetization direction MD_PU of the second magnetic pattern MGP2.

According to an embodiment, the second magnetic pattern MGP2 and the second spacer layer SPL2 may be omitted. For example, a bottom surface of the first magnetic pattern MGP1 may be in contact with the tunnel barrier pattern TBP, and a top surface of the first magnetic pattern MGP1 may be in contact with the electrode pattern TEL.

The electrode patterns TEL may include a conductive material. For example, the electrode pattern TEL may include one or more of metal (e.g., copper, tungsten, or aluminum) and metal nitride (e.g., tantalum nitride, titanium nitride, or tungsten nitride).

The lower magnetic domains D_L in the lower magnetic layer LML and the upper magnetic layer UML in the upper magnetic domains D_U may have perpendicular magnetic anisotropy (PMA). Each of the lower magnetic domains D_L in the lower magnetic layer LML may have a magnetization direction MD_L that is perpendicular to an interface between the lower magnetic layer LML and the first spacer layer SPL1. The magnetization direction MD_L of each of the lower magnetic domains D_L may be parallel to the third direction D3. The magnetization directions MD_L of neighboring lower magnetic domains D_L may be parallel or antiparallel to each other. A lower magnetic domain wall DW_L may be defined between neighboring lower magnetic domains D_L.

Each of the upper magnetic domains D_U in the upper magnetic layer UML may have a magnetization direction MD_U that is perpendicular to an interface between the upper magnetic layer UML and the first spacer layer SPL1. The magnetization directions MD_U of neighboring upper magnetic domains D_U may be parallel or antiparallel to each other. An upper magnetic domain wall DW_U may be defined between neighboring upper magnetic domains D_U.

The upper magnetic domains D_U may vertically overlap corresponding lower magnetic domains D_L. The overlapped upper and lower magnetic domains D_U and D_L may be antiferromagnetically coupled to each other through the first spacer layer SPL1. The magnetization direction MD_U of the upper magnetic domain D_U may be antiparallel to the magnetization direction MD_L of the lower magnetic domain D_L that corresponds to the upper magnetic domain D_U.

Referring back to FIG. 2, when a current CUR flows in the first direction D1 in the second conductive line CL2, the lower magnetic domains D_L may move in the first direction D1 or in a direction opposite to the first direction D1. It may be observed that movement of the lower magnetic domain walls DW_L caused by the current CUR causes relative movement of the lower magnetic domains D_L. The lower magnetic domains D_L on the second conductive line CL2 may move in a direction parallel or antiparallel to the current CUR. In an embodiment, the lower magnetic domains D_L on the second conductive line CL2 may move in the first direction D1 parallel to the current CUR.

The movement of the lower magnetic domains D_L (or the lower magnetic domain walls DW_L) may be attributed to the Dzyaloshinskii-Moriya interaction (DMI) and the spin-orbit torque (SOT) occurring at an interface between the second conductive line CL2 and the lower magnetic layer LML. The movement direction of the lower magnetic domain walls DW_L may depend on chirality of the lower magnetic domain walls DW_L.

As the lower magnetic domain walls DW_L in the lower magnetic layer LML move in the first direction D1, the upper magnetic domain walls DW_U in the upper magnetic layer UML may also move in the first direction D1. The movement of the upper magnetic domain walls DW_U may be attributed to an antiferromagnetic coupling between the lower magnetic layer LML and the upper magnetic layer UML. When viewed from another aspect, as the lower magnetic domains D_L in the lower magnetic layer LML move in the first direction D1, the upper magnetic domains D_U in the upper magnetic layer UML may also move in the first direction D1.

The first magnetic pattern MGP1 of the read/write element RWE may have perpendicular magnetic anisotropy (PMA). The first magnetic pattern MGP1 may have a magnetization direction MD_PL that is perpendicular to an interface between the first magnetic pattern MGP1 and the tunnel barrier pattern TBP. The magnetization direction MD_PL of the first magnetic pattern MGP1 may be fixed.

The first and second magnetic patterns MGP1 and MGP2 may vertically overlap one magnetic domain MDO in the magnetic track MTR. A magnetic tunnel junction MTJ may be constituted by the first and second magnetic patterns MGP1 and MGP2, and the magnetic domain MDO that underlies the first and second magnetic patterns MGP1 and MGP2. The first and second magnetic patterns MGP1 and MGP2 may be pinned layers that have their fixed magnetization directions MD_PL and MD_PU. Corresponding upper and lower magnetic domains D_U and D_L may be antiferromagnetically coupled to constitute a free layer having a synthetic antiferromagnetic structure.

In a read operation mode of the read/write element RWE, a read current may flow through the magnetic tunnel junction MTJ. The read current may be used to detect a resistance state of the magnetic tunnel junction MTJ. The read current may detect whether the magnetic tunnel junction MTJ is either in a high resistance state or in a low resistance state. A data (0 or 1) stored in the magnetic domain MDO may be detected from a resistance state of the magnetic tunnel junction MTJ. In this sense, each of the magnetic domains MDO in the magnetic track MTR may correspond to one bit.

In a write operation mode of the read/write element RWE, a write current may flow through the magnetic tunnel junction MTJ. The write current may have a magnitude greater than that of the read current. The spin-orbit torque generated by the write current may switch the magnetization direction MD_U of a corresponding upper magnetic domain D_U. The magnetization direction MD_L of the lower magnetic domain D_L antiferromagnetically coupled to the upper magnetic domain D_U may be switched to be antiparallel to the magnetization direction MD_U of the upper magnetic domain D_U.

Referring back to FIGS. 1 and 2, as discussed previously, the first to fourth conductive lines CL1 to CL4 may be alternately arranged on the top surface TS or the bottom surface BS of the magnetic track MTR. A current may thus flow through the first to fourth conductive lines CL1 to CL4 on the first to fourth parts PA1 to PA4, or on an entire region of the magnetic track MTR.

For example, the second conductive line CL2 may include a first end part ENP1 and a second end part ENP2 that are correspondingly at, e.g., adjacent to, opposite ends of the second conductive line CL2. The first end part ENP1 and the second end part ENP2 may be opposite to each other in the first direction D1. A first contact CNT1 may be electrically connected to the first end part ENP1. A second contact CNT2 may be electrically connected to the second end part ENP2.

A first voltage may be applied through the first contact CNT1 to the first end part ENP1, and a second voltage may be applied through the second contact CNT2 to the second end part ENP2. For example, the first voltage may be a positive voltage Vp, and the second voltage may be a ground voltage of 0 V. As the Vp and the 0 V are correspondingly applied to opposite ends of the second conductive line CL2, a difference in voltage may be provided between opposite ends of the second conductive line CL2. Therefore, the current CUR may flow in the first direction D1 in the second conductive line CL2.

Referring to FIG. 1, the first voltage may be applied through the first contact CNT1 to one of opposite end parts of the first conductive line CL1, and the second voltage may be applied through the second contact CNT2 to another of opposite ends of the first conductive line CL1. Thus, a current CUR may flow in a direction opposite to the second direction D2 in the first conductive line CL1. The first voltage may be applied through the first contact CNT1 to one of opposite end parts of the third conductive line CL3, and the second voltage may be applied through the second contact CNT2 to another of opposite ends of the third conductive line CL3. Thus, a current CUR may flow in the second direction D2 in the third conductive line CL3. The first voltage may be applied through the first contact CNT1 to one of opposite end parts of the fourth conductive line CL4, and the second voltage may be applied through the second contact CNT2 to another of opposite ends of the fourth conductive line CL4. Thus, a current CUR may flow in a direction opposite to the first direction D1 in the fourth conductive line CL4.

In the present embodiment, neighboring ones of the first to fourth conductive lines CL1 to CL4 may have their end parts that vertically overlap each other. For example, referring to FIG. 1, the first end part ENP1 of the second conductive line CL2 may vertically overlap an end part of the third conductive line CL3 that overlies the second conductive line CL2. The second end part ENP2 of the second conductive line CL2 may vertically overlap an end part of the first conductive line CL1 that overlies the second conductive line CL2.

If a magnetic memory device were to include a single continuous loop-shaped conductive line below a magnetic track (e.g., on a same surface of the magnetic track in its entirety), such a conductive line would have had opposite ends on a same surface that are spaced apart from each other without being connected to each other. In other words, the loop shape of the conductive line would not be closed, so the opposite ends would face each other without physically being connected to each other. In this case, if a first voltage were to be applied through a first contact to a first end of the conductive line, and a second voltage were to be applied through a second contact to a second end of the conductive line, a current would flow in a counterclockwise direction in the conductive line. However, when the opposite ends of such a single conductive line are spaced apart from each other, a spin-orbit torque gap may occur between the opposite ends, thereby causing a large variation in movement speed of a magnetic domain (or magnetic domain wall), large dielectric, abnormality in operation, and deterioration in reliability of the magnetic memory device.

In contrast, according to example embodiments, the first to fourth conductive lines CL1 to CL4 are separated from each other by being alternately disposed on and below the magnetic track MTR. Therefore, the current CUR may flow in each of the first to fourth conductive lines CL1 to CL4 by generating a voltage difference in each of the first to fourth conductive lines CL1 to CL4.

The first to fourth conductive lines CL1 to CL4 may respectively cover the first to fourth parts PA1 to PA4, or an entire region of the magnetic track MTR. For example, according to embodiments, neighboring ones of the first to fourth conductive lines CL1 to CL2 may have their end parts that vertically overlap each other, and thus, an entire region of the magnetic track MTR may be completely covered. As such, an SOT gap may not be created, and accordingly, the movement speed of the magnetic domain MDO may be controlled to have a uniform movement speed, and the magnetic memory device may be prevented from malfunction.

Figure 3:
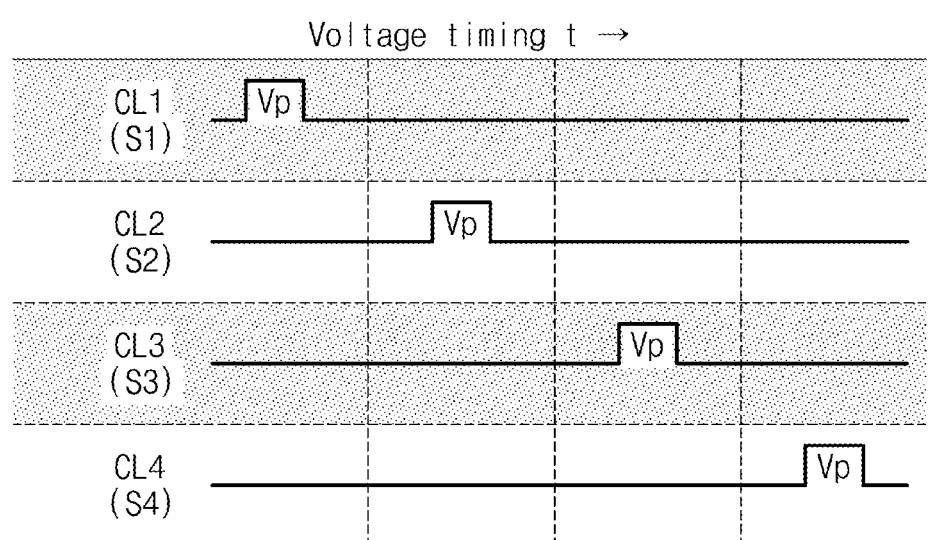
FIG. 3 illustrates a graph of pulse application timings of first to fourth conductive lines in a method of operating a magnetic memory device according to some embodiments.

FIG. 3 illustrates a graph showing pulse application timings of first to fourth conductive lines CL1 to CL4 in a method of operating a magnetic memory device according to some embodiments. FIGS. 4A to 4E illustrate plan views showing a method of operating a magnetic memory device according to some embodiments.

Figure 4A:
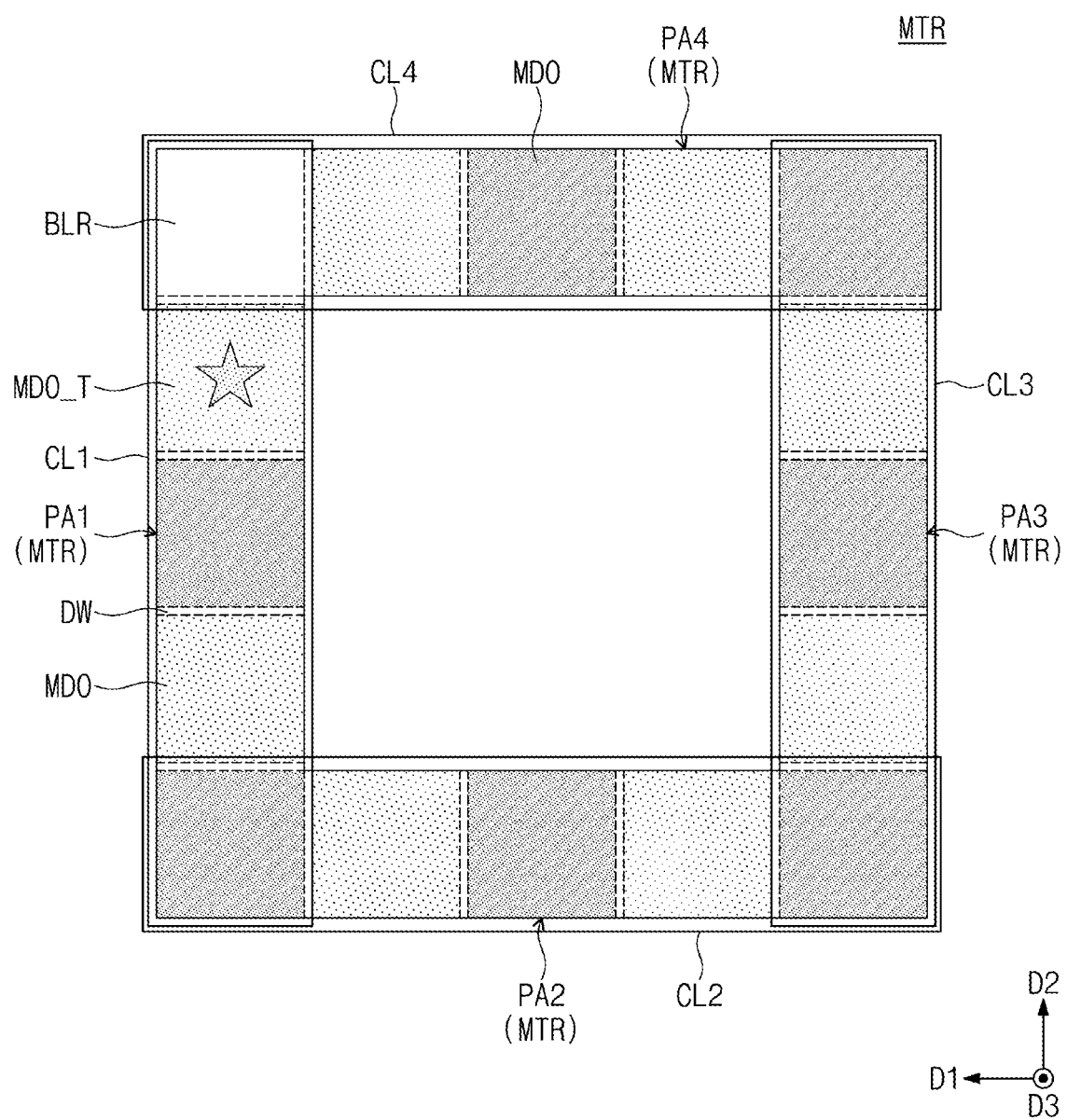
FIGS. 4A to 4E illustrate plan views of stages in a method of operating a magnetic memory device according to some embodiments.

Referring to FIG. 4A, there may be provided a magnetic track MTR according to an embodiment. The magnetic track MTR according to the present embodiment may be substantially the same as the magnetic track MTR of the magnetic memory device discussed above with reference to FIGS. 1 and 2. The magnetic track MTR may include the first to fourth parts PA1 to PA4 connected to each other to allow the magnetic track MTR to have a loop shape, and the first to fourth conductive lines CL1 to CL4 respectively provided on the first to fourth parts PA1 to PA4 of the magnetic track MTR.

As discussed above with reference to FIGS. 1 and 2, the first to fourth conductive lines CL1 to CL4 may be alternately arranged on top and bottom surfaces of the magnetic track MTR. The first and third conductive lines CL1 and CL3 may be provided on the top surface of the magnetic track MTR, and the second and fourth conductive lines CL2 and CL4 may be provided on the bottom surface of the magnetic track MTR.

The magnetic track MTR may include the plurality of magnetic domains MDO. A magnetic domain wall DW may be provided between neighboring magnetic domains MDO. One of the plurality of magnetic domains MDO may be defined as a target magnetic domain MDO_T according to the present embodiment. The target magnetic domain MDO_T is marked with a star symbol for differentiation from other magnetic domains MDO. The magnetic track MTR may include at least one empty region BLR. For example, the empty region BLR may be positioned at a location where the first part PA1 meets the fourth part PA4.

Figure 4B:
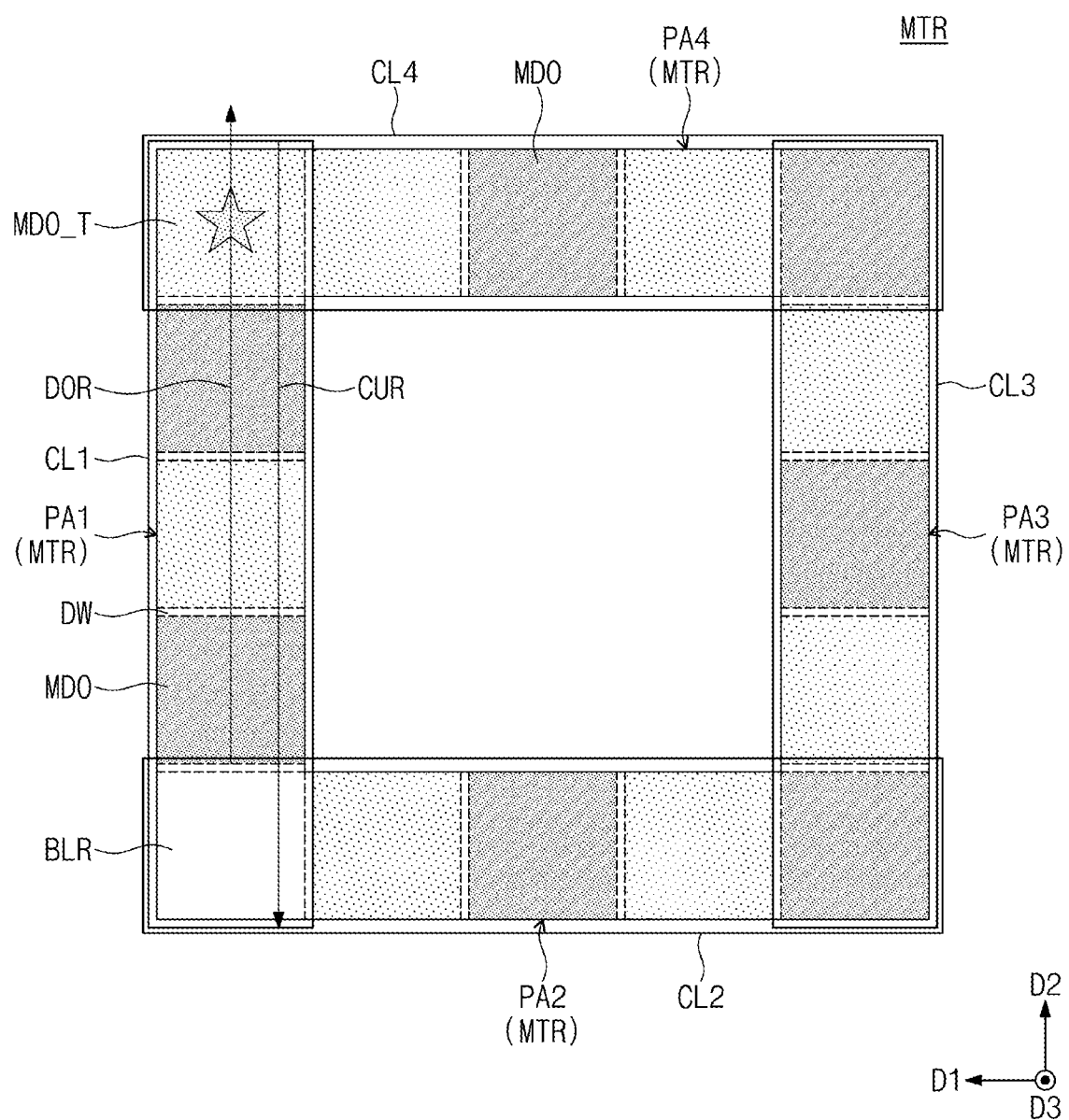

Referring to FIGS. 3 and 4B, as a first step S1, the first conductive line CL1 may be provided with a pulse (or voltage) to cause a current CUR to flow in the first conductive line CL1. The current CUR in the first conductive line CL1 may flow in a direction opposite to the second direction D2. The current CUR in the first conductive line CL1 may flow in the counterclockwise direction.

The current CUR in the first conductive line CL1 may cause the magnetic domains MDO in the first part PA1 to move in the second direction D2. The magnetic domains MDO in the first part PA1 may move in a clockwise direction. A magnetic domain movement direction DOR of the first part PA1 may be the clockwise direction. The first conductive line CL1 may be provided on the top surface of the magnetic track MTR, and thus, the magnetic domain movement direction DOR of the first part PA1 may be opposite to a direction of the current CUR.

As the current CUR causes the target magnetic domain MDO_T to move in the clockwise direction, the target magnetic domain MDO_T may occupy the empty region BLR, e.g., the target magnetic domain MDO_T may move from its position in FIG. 4A one step into the empty region BLR in FIG. 4B. As the magnetic domains MDO in the first part PA1 move all together in the clockwise direction, the empty region BLR may be newly formed at a location where the first part PA1 and the second part PA2 meet each other, e.g., all the magnetic domains MDO in the first part PA1 may move together to occupy the empty region BLR thereby defining the empty region BLR at a new position in FIG. 4B (opposite end relative to its position in FIG. 4A).

Figure 4C:
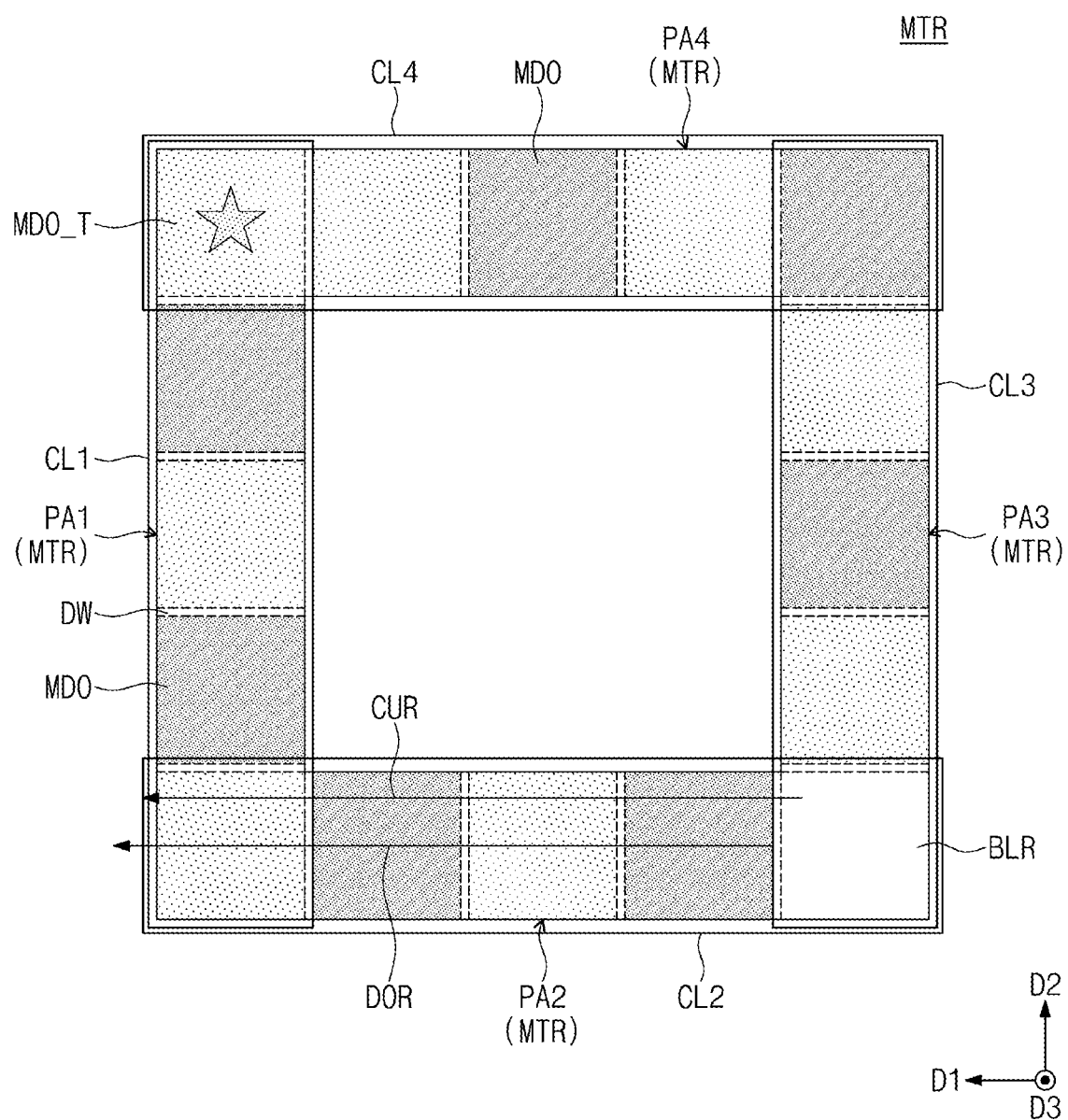

Referring to FIGS. 3 and 4C, as a second step S2, the second conductive line CL2 may be provided with a pulse to cause a current CUR to flow in the second conductive line CL2. The current CUR in the second conductive line CL2 may flow in the first direction D1. The current CUR in the second conductive line CL2 may flow in the clockwise direction. The current direction (e.g., the clockwise direction) in the second conductive line CL2 may be opposite to the aforementioned current direction (e.g., the counterclockwise direction) in the first conductive line CL1.

The current CUR in the second conductive line CL2 may cause the magnetic domains MDO in the second part PA2 to move in the first direction D1 (or the clockwise direction). The magnetic domains MDO in the second part PA2 may move in the clockwise direction. A magnetic domain movement direction DOR in the second part PA2 may be the same clockwise direction as the aforementioned magnetic domain movement direction DOR of the first part PA1. The second conductive line CL2 may be provided on the bottom surface of the magnetic track MTR, and thus, the magnetic domain movement direction DOR of the second part PA2 may be the same as a direction of the current CUR.

As the current CUR causes the magnetic domains MDO in the second part PA2 to move in the clockwise direction, the magnetic domains MDO in the second part PA2 may slide along the first direction toward the empty region BLR to occupy the empty region BLR. As the magnetic domains MDO in the second part PA2 move all together in the clockwise direction, the empty region BLR may be newly formed, e.g., defined, at a location where the second part PA2 and the third part PA3 meet each other. In the second step S2, the target magnetic domain MDO_T may be fixed without moving.

Figure 4D:
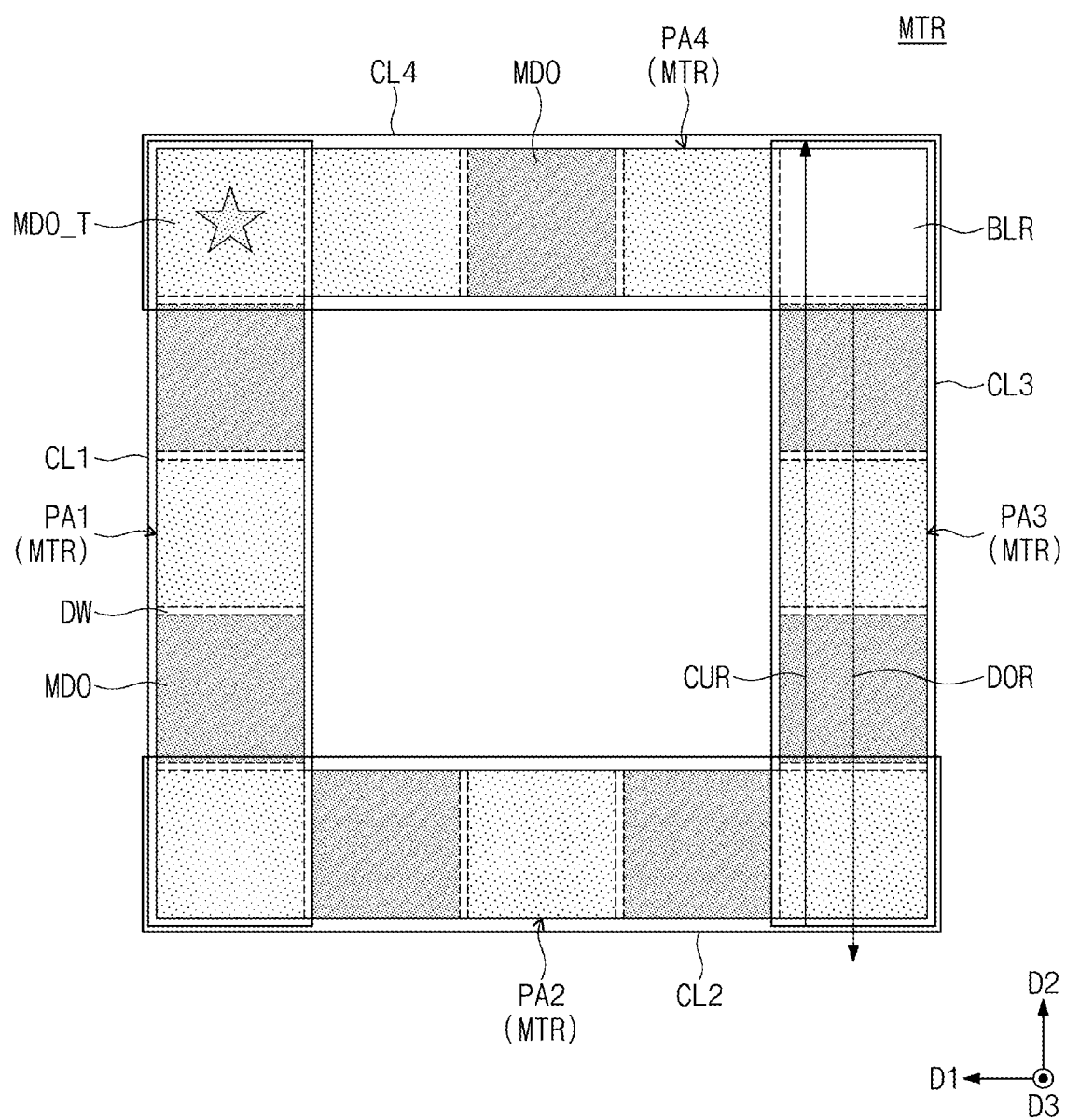

Referring to FIGS. 3 and 4D, as a third step S3, the third conductive line CL3 may be provided with a pulse to cause a current CUR to move in the third conductive line CL3. The current CUR in the third conductive line CL3 may flow in the counterclockwise direction. The current direction (e.g., the counterclockwise direction) in the third conductive line CL3 may be opposite to the aforementioned current direction (e.g., the clockwise direction) in the second conductive line CL2.

The current CUR in the third conductive line CL3 may cause the magnetic domains MDO in the third part PA3 to move in the clockwise direction. A magnetic domain movement direction DOR in the third part PA3 may be the same clockwise direction as the aforementioned magnetic domain movement direction DOR of the second part PA2. The third conductive line CL3 may be provided on the top surface of the magnetic track MTR, and thus the magnetic domain movement direction DOR of the third part PA3 may be opposite to a direction of the current CUR.

As the magnetic domains MDO in the third part PA3 move all together in the clockwise direction, the empty region BLR may be newly formed at a location where the third part PA3 and the fourth part PA4 meet each other. In the third step S3, the target magnetic domain MDO_T may be fixed without moving.

Figure 4E:
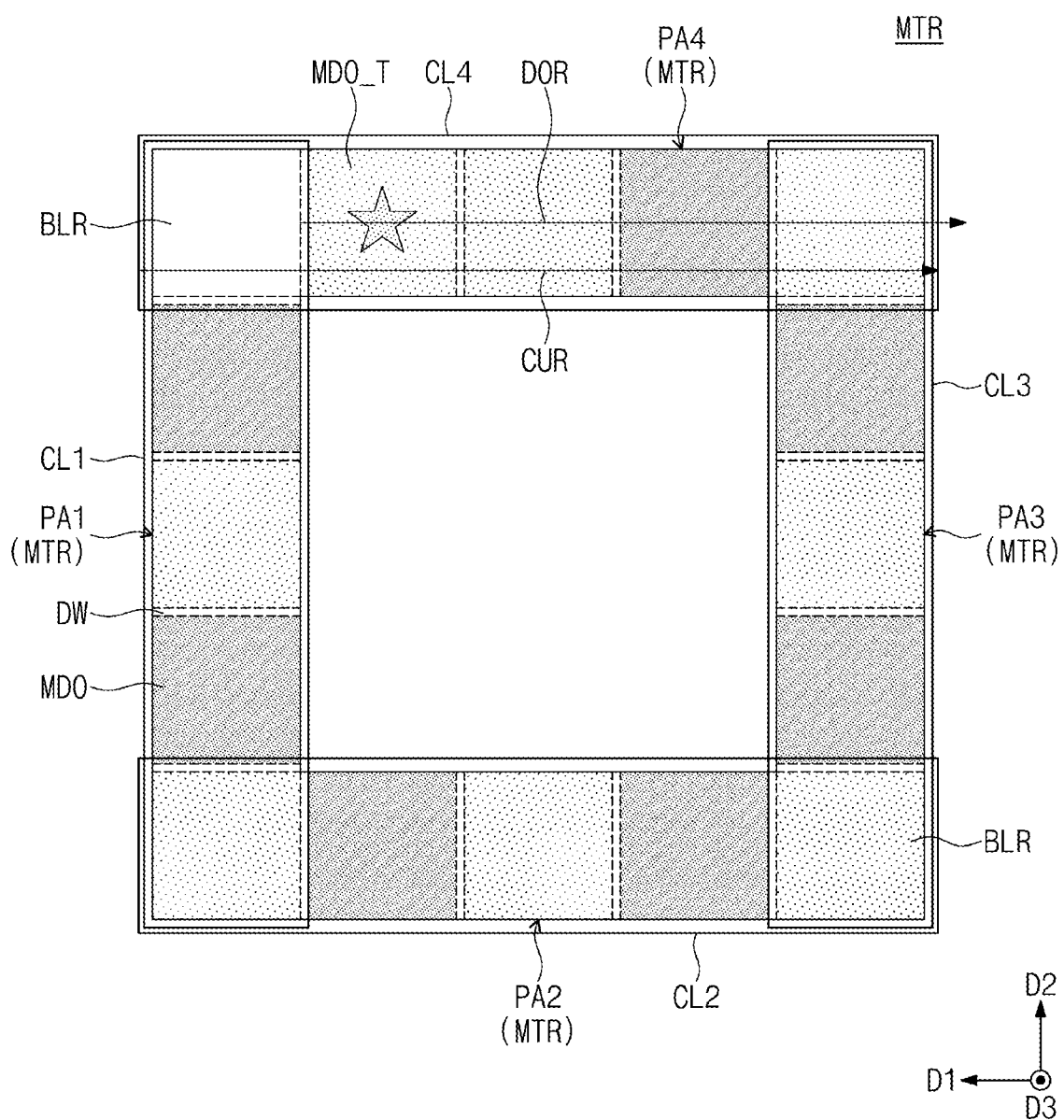

Referring to FIGS. 3 and 4E, as a fourth step S4, the fourth conductive line CL4 may be provided with a pulse to cause a current CUR to flow in the fourth conductive line CL4. The current CUR in the fourth conductive line CL4 may flow in the clockwise direction. The current direction (e.g., the clockwise direction) in the fourth conductive line CL4 may be opposite to the aforementioned current direction (e.g., the counterclockwise direction) in the third conductive line CL3.

The current CUR in the fourth conductive line CL4 may cause the magnetic domains MDO in the fourth part PA4 to move in the clockwise direction. A magnetic domain movement direction DOR in the fourth part PA4 may be the same clockwise direction as the aforementioned magnetic domain movement direction DOR of the third part PA3. The fourth conductive line CL4 may be provided on the bottom surface of the magnetic track MTR, and thus, the magnetic domain movement direction DOR of the fourth part PA4 may be the same as a direction of the current CUR.

The current CUR may cause the target magnetic domain MDO_T to move in the clockwise direction. As the magnetic domains MDO in the fourth part PA4 move all together in the clockwise direction, the empty region BLR may be newly formed at a location where the fourth part PA4 and the first part PA1 meet each other.

Referring back to FIGS. 3 and 4A to 4E, the first to fourth conductive lines CL1 to CL4 may not be simultaneously provided, but may be sequentially provided with the pulse to move the magnetic domains MDO. For example, the target magnetic domain MDO_T may experience the first to fourth steps S1 to S4 to move in the clockwise direction from the first part PA1 to the fourth part PA4. The first to fourth steps S1 to S4 of FIG. 3 may be repeatedly performed to cause the magnetic domains MDO in the magnetic track MTR to continuously move (or circulate) in the clockwise direction.

The magnetic memory device according to the present embodiment may read or write data while using the aforementioned method to move the magnetic domains MDO.

In the magnetic memory device in which spin-orbit torque is used according to some embodiments, as the conductive lines CL1 to CL4 are positioned on the top or bottom surface of the magnetic track MTR, a current direction and a magnetic domain movement direction may be parallel or antiparallel to each other. For example, when the current CUR flows in the counterclockwise direction in the first conductive line CL1 positioned on the top surface of the magnetic track MTR, as shown in FIG. 4B, the magnetic domain movement direction DOR may be in the clockwise direction. In this case, the direction of the current CUR on the first conductive line CL1 may be antiparallel (or opposite) to the magnetic domain movement direction DOR. When the current CUR flows in the clockwise direction in the second conductive line CL2 positioned on the bottom surface of the magnetic track MTR, as shown in FIG. 4C, the magnetic domain movement direction DOR may be in the clockwise direction. In this case, the direction of the current CUR on the second conductive line CL2 may be parallel (or identical) to the magnetic domain movement direction DOR. As a result, the first to fourth conductive lines CL1 to CL4 according to embodiments may be configured to cause the current CUR to alternately flow in the clockwise or counterclockwise direction so as to circulate the magnetic domains MDO.

Figure 5:
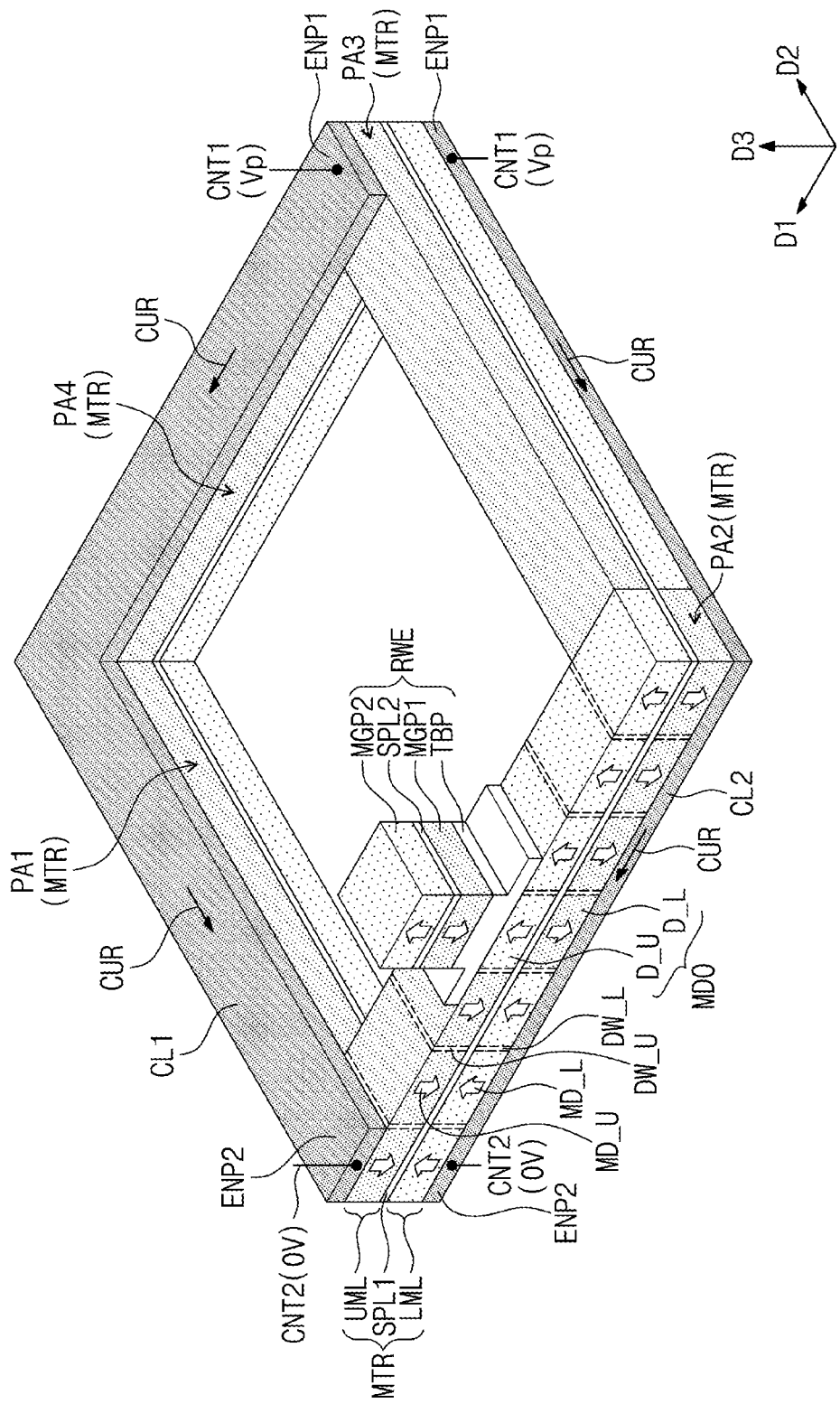
FIG. 5 illustrates a simplified perspective view showing a magnetic memory device according to some embodiments.
Figure 6:
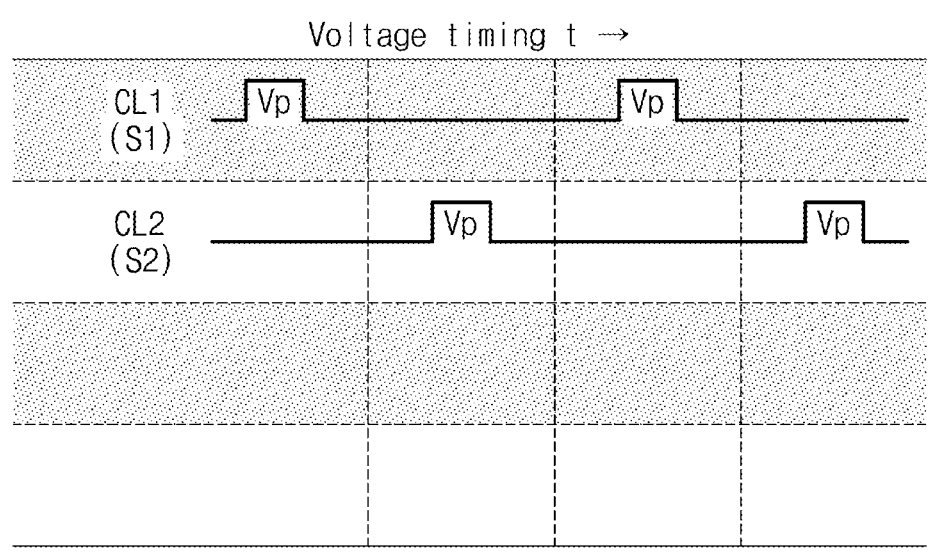
FIG. 6 illustrates a graph of pulse application timings of first and second conductive lines in a method of operating a magnetic memory device according to some embodiments.

FIG. 5 illustrates a simplified perspective view of a magnetic memory device according to some embodiments. FIG. 6 illustrates a graph showing pulse application timings of first and second conductive lines in a method of operating a magnetic memory device according to some embodiments. In the embodiment that follows, a detailed description of technical features repetitive to those discussed above with reference to FIGS. 1 and 2 will be omitted, and a difference thereof will be discussed in detail.

Referring to FIG. 5, a first conductive line CL1' and a second conductive line CL2' may be provided on the magnetic track MTR. The first conductive line CL1' may be provided on the first and fourth parts PA1 and PA4 of the magnetic track MTR. The first conductive line CL1' may be provided on top surfaces of the first and fourth parts PA1 and PA4. The first conductive line CL1' may include a region that extends in the second direction D2 on the first part PA1 and a region that extends in the first direction D1 on the fourth part PA4. For example, the first conductive line CL1' may have an L shape, e.g., the first conductive line CL1' may extend continuously along the first and fourth parts PA1 and PA4 of the magnetic track MTR to have an L shape.

The second conductive line CL2' may be provided on the second and third parts PA2 and PA3 of the magnetic track MTR. The second conductive line CL2' may be provided on bottom surfaces of the second and third parts PA2 and PA3. The second conductive line CL2' may include a region that extends in the first direction D1 on the second part PA2 and a region that extends in the second direction D2 on the third part PA3. For example, the second conductive line CL2 may have an L shape, e.g., the second conductive line CL2' may extend continuously along the second and third parts PA2 and PA3 of the magnetic track MTR to have an L shape.

A first end part ENP1 of the first conductive line CL1' may vertically overlap a first end part ENP1 of the second conductive line CL2'. A first voltage Vp may be applied through a first contact CNT1 to the first end part ENP1 of the first conductive line CL1' and to the first end part ENP1 of the second conductive line CL2'.

A second end part ENP2 of the first conductive line CL1' may vertically overlap a second end part ENP2 of the second conductive line CL2. A second voltage 0 V may be applied through a second contact CNT2 to the second end part ENP2 of the first conductive line CL1' and to the second end part ENP2 of the second conductive line CL2'.

Referring to FIGS. 5 and 6, the movement of the magnetic domains MDO in a magnetic memory device according to the present embodiment may include sequentially applying a pulse to the first conductive line CL1' and the second conductive line CL2'. When a pulse is alternately and repeatedly applied to the first conductive line CL1' and the second conductive line CL2', as discussed above with reference to FIGS. 4A to 4E, the magnetic domains MDO may move in the clockwise direction along the magnetic track MTR.

Figure 7:
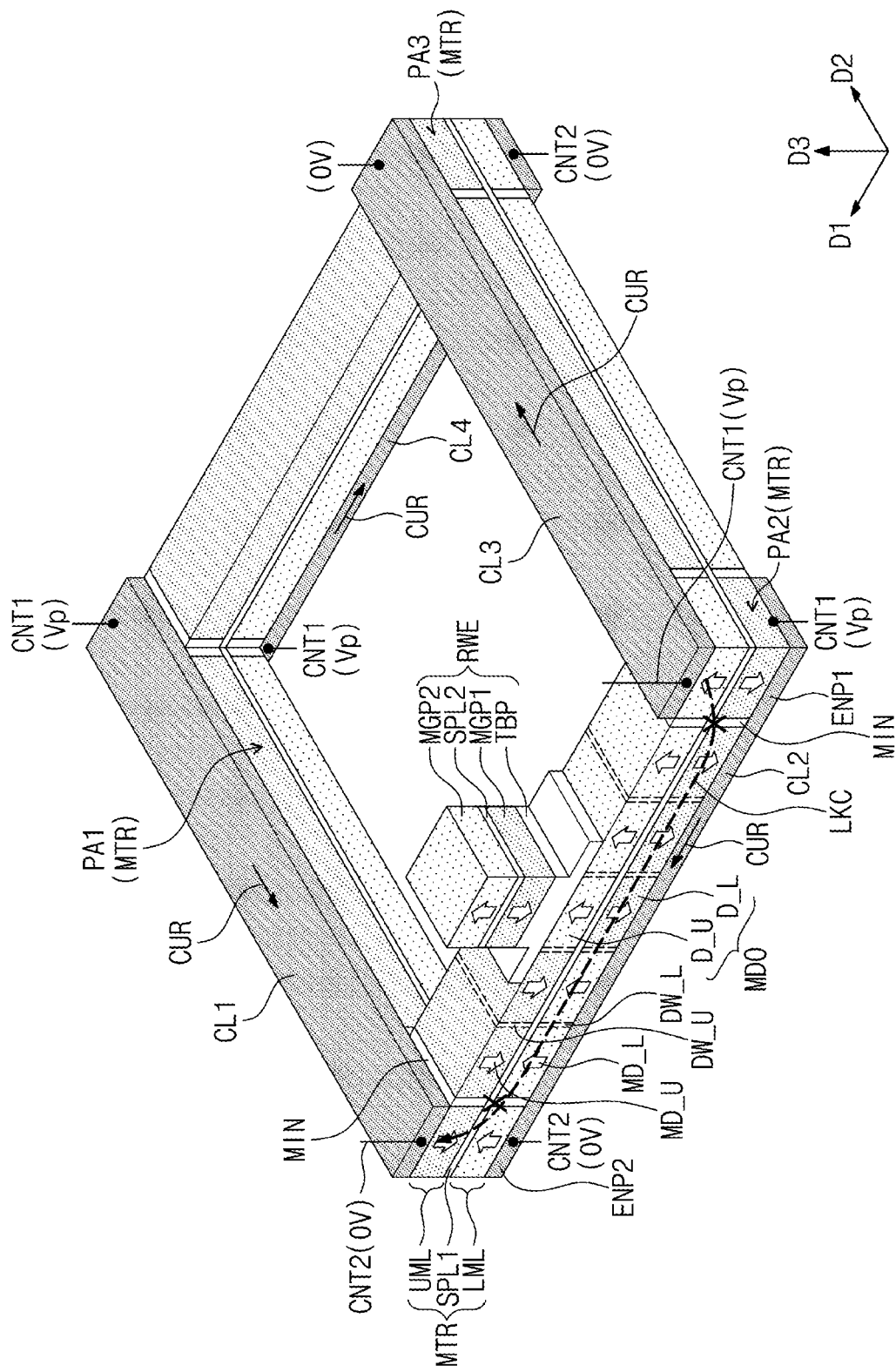
FIG. 7 illustrates a simplified perspective view of a magnetic memory device according to some embodiments.

FIG. 7 illustrates a simplified perspective view of a magnetic memory device according to some embodiments. In the embodiment that follows, a detailed description of technical features repetitive to those discussed above with reference to FIGS. 1 and 2 will be omitted, and a difference thereof will be discussed in detail.

Referring to FIG. 7, magnetic insulators MIN may be provided in the magnetic track MTR. The magnetic insulators MIN may be disposed at corresponding corners of the magnetic track MTR. For example, the magnetic insulators MIN in the second part PA2 of the magnetic track MTR may be correspondingly disposed adjacent to the first conductive line CL1 and the third conductive line CL3.

A leakage current LKC may potentially occur through the second part PA2 between the first and third conductive lines CL1 and CL3 of the magnetic track MTR. The magnetic insulators MIN according to the present embodiment may be disposed between the first and third conductive lines CL1 and CL3, thereby preventing the leakage current LKC. Therefore, the leakage current LKC may be effectively prevented while maintaining magnetic properties of the magnetic track MTR, which may result in an improvement of a magnetic memory device.

Each of the magnetic insulators MIN may include a ferrimagnetic insulator or a ferromagnetic insulator. For example, each of the magnetic insulators MIN may include at least one of $MgFe_2O_4$, $Fe_3O_4$, $NiFe_2O_4$, $Li_{0.5}Fe_{2.5}O_4$, $NiFe_2O_4$, and $CoFe_2O_4$.

By way of summation and review, a magnetic track may have a linear shape with opposite ends at opposite ends of the linear shape along a longitudinal direction of the linear shape. Such a magnetic track may include an empty region (i.e., a region that has no magnetization direction in a magnetic track or includes no data) and magnetic domains with data aligned along the linear shape of the magnetic track. A read/write element on the magnetic domains may reciprocally move between the opposite ends of the magnetic track to read or write data of the magnetic domains, e.g., so the magnetic domains may move along the linear shape of the magnetic track by moving into the empty region.

In order to allow all of the magnetic domains to pass through the read/write element, it may be required that the size of the empty region be increased, e.g., to occupy half of the linear magnetic track. However, the increased size of the empty region may reduce the data storage region (i.e., the area occupied by the magnetic domains MDO), thereby reducing data density.

In contrast, example embodiments provide a magnetic memory device including a loop-type magnetic track (rather than a linear magnetic track) and a method of operating the same. That is, a magnetic memory device according to embodiments may include a loop-type magnetic track to fill most regions of the magnetic track with magnetic domains (e.g., to minimize the size of the empty region), thereby providing a magnetic memory device with increased data density. For example, as compared to the linear magnetic track, the loop-type magnetic track requires a smaller empty region, e.g., a ratio of the empty region to the magnetic track in the loop-type magnetic track may range from about 0% to about 10% (e.g., as opposed to nearly 50% in the linear magnetic track).

Further, a magnetic memory device according to embodiments may include conductive lines alternately disposed on and below the magnetic track, thereby preventing a spin-orbit torque gap (e.g., as compared to a having a single continuous conductive line on a same surface of the magnetic track). Accordingly, it may be possible to prevent malfunctions and to increase reliability of the magnetic memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A magnetic memory device, comprising:
a magnetic track having a loop shape, the magnetic track including a first part and a second part that are arranged in a counterclockwise direction;
a first conductive line on a top surface of the first part; and
a second conductive line on a bottom surface of the second part,
wherein the magnetic track includes a lower magnetic layer, a spacer layer, and an upper magnetic layer that are sequentially stacked,
wherein each of the first conductive line and the second conductive line includes a heavy metal, each of the first conductive line and the second conductive line being configured to generate spin-orbit torque caused by current that flows therein, and
wherein magnetic domains in the magnetic track are configured to move in a clockwise direction or in the counterclockwise direction by the spin-orbit torque.

2. The device as claimed in claim 1, wherein:
the first conductive line includes a first end part and a second end part that are correspondingly adjacent to opposite ends of the first conductive line,
the second conductive line includes a third end part and a fourth end part that are correspondingly adjacent to opposite ends of the second conductive line, and
the first end part and the third end part vertically overlap each other.

3. The device as claimed in claim 2, further comprising:
a first contact and a second contact that are electrically connected to the first end part and the second end part, respectively; and a third contact and a fourth contact that are electrically connected to the third end part and the fourth end part, respectively, wherein the first contact and the third contact are connected to a first voltage, and wherein the second contact and the fourth contact are connected to a second voltage.

4. The device as claimed in claim 1, wherein the lower magnetic layer and the upper magnetic layer are antiferromagnetically coupled to each other through the spacer layer.

5. The device as claimed in claim 1, wherein:

the first conductive line is on the upper magnetic layer, and the second conductive line is on the lower magnetic layer.

6. The device as claimed in claim 1, wherein:

the lower magnetic layer includes lower magnetic domains and lower magnetic domain walls between the lower magnetic domains, the upper magnetic layer includes upper magnetic domains and upper magnetic domain walls between the upper magnetic domains, and the lower magnetic domains and the upper magnetic domains correspondingly and vertically overlap each other to constitute the magnetic domains.

7. The device as claimed in claim 1, further comprising a read/write element on the magnetic track, the read/write element including a tunnel barrier pattern, a magnetic pattern, and an electrode pattern that are sequentially stacked on the magnetic track, and the magnetic pattern having a fixed magnetization direction.

8. The device as claimed in claim 7, wherein the magnetic track is between the read/write element and one of the first conductive line and the second conductive line.

9. The device as claimed in claim 1, further comprising a third conductive line and a fourth conductive line, wherein the magnetic track further includes a third part and a fourth part, wherein the first part, the second part, the third part, and the fourth part are arranged in the counterclockwise direction, the first part and the fourth part being connected to each other, wherein the third conductive line is on a top surface of the third part, and wherein the fourth conductive line is on a bottom surface of the fourth part.

10. The device as claimed in claim 1, wherein:

a corner of the magnetic track is where the first part and the second part meet each other, the magnetic track includes a magnetic insulator adjacent to the corner, and the magnetic insulator includes at least one of $MgFe_2O_4$, $Fe_3O_4$, $NiFe_2O_4$, $Li_{0.5}Fe_{2.5}O_4$, $NiFe_2O_4$, and $CoFe_2O_4$.

11. A magnetic memory device, comprising:

a magnetic track having a loop shape, the magnetic track including a first part and a second part that are arranged in a counterclockwise direction;

a first conductive line on a top surface of the first part; and a second conductive line on a bottom surface of the second part, wherein the magnetic track includes a lower magnetic layer, a spacer layer, and an upper magnetic layer that are sequentially stacked, wherein each of the first conductive line and the second conductive line is configured to generate spin-orbit torque caused by current that flows therein, wherein the first conductive line is configured to allow the current to flow in a clockwise direction or in the counterclockwise direction, wherein the second conductive line is configured to allow the current to flow in the counterclockwise direction or in the clockwise direction, and wherein a direction of the current in the first conductive line is opposite to a direction of the current in the second conductive line.

12. The device as claimed in claim 11, wherein a movement direction of a magnetic domain on the first conductive line is the same as a movement direction of a magnetic domain on the second conductive line.

13. The device as claimed in claim 11, wherein:

the first conductive line includes a first end part and a second end part that are correspondingly adjacent to opposite ends of the first conductive line, the second conductive line includes a third end part and a fourth end part that are correspondingly adjacent to opposite ends of the second conductive line, and the first end part and the third end part vertically overlap each other.

14. The device as claimed in claim 13, further comprising:

a first contact and a second contact that are electrically connected to the first end part and the second end part, respectively; and a third contact and a fourth contact that are electrically connected to the third end part and the fourth end part, respectively, wherein the first contact and the third contact are connected to a first voltage, and wherein the second contact and the fourth contact are connected to a second voltage.

15. The device as claimed in claim 11, further comprising a read/write element on the magnetic track, the read/write element including a tunnel barrier pattern, a magnetic pattern, and an electrode pattern that are sequentially stacked on the magnetic track, and the magnetic pattern having a fixed magnetization direction.

* * * * *